US010509052B2

(12) United States Patent
Thaulad et al.

(10) Patent No.: US 10,509,052 B2
(45) Date of Patent: Dec. 17, 2019

(54) SMART VIBRATION WAFER WITH OPTIONAL INTEGRATION WITH SEMICONDUCTOR PROCESSING TOOL

(71) Applicant: Lam Research Corporation, Fremont, CA (US)

(72) Inventors: Peter S. Thaulad, San Jose, CA (US); Arulselvam Simon Jeyapalan, Newark, CA (US); Richard M. Blank, San Jose, CA (US); Tyson Lee Ringold, Mountain View, CA (US); Victor Eduardo Espinosa, III, San Luis Obispo, CA (US)

(73) Assignee: Lam Research Corporation, Fremont, CA (US)

( * ) Notice: Subject to any disclaimer, the term of this patent is extended or adjusted under 35 U.S.C. 154(b) by 229 days.

(21) Appl. No.: 15/425,921

(22) Filed: Feb. 6, 2017

(65) Prior Publication Data

US 2018/0224500 A1 Aug. 9, 2018

(51) Int. Cl.
*G01R 31/02* (2006.01)
*G01P 15/18* (2013.01)
*H01L 21/67* (2006.01)

(52) U.S. Cl.
CPC ........ *G01P 15/18* (2013.01); *H01L 21/67253* (2013.01)

(58) Field of Classification Search
USPC ............. 324/756.01, 756.02, 757.01, 757.03
See application file for complete search history.

(56) References Cited

U.S. PATENT DOCUMENTS

| 5,444,637 | A  | 8/1995  | Smesny et al. |
| 7,029,930 | B2 | 4/2006  | Tomer et al. |
| 7,233,874 | B2 | 6/2007  | Ye et al. |
| 7,283,255 | B2 | 10/2007 | Ramsey et al. |
| 7,289,230 | B2 | 10/2007 | Ramsey et al. |
| 7,331,250 | B2 | 2/2008  | Hunter |
| 7,434,485 | B2 | 10/2008 | Hunter |
| 7,456,977 | B2 | 11/2008 | Ramsey et al. |
| 7,676,342 | B2 | 3/2010  | Vreede et al. |

(Continued)

OTHER PUBLICATIONS

"Get accurate readings and improve your yield: Meet the thin and light Auto Multi Sensor from CyperOptics," CyberOptics, 2016, 2 pgs.

(Continued)

*Primary Examiner* — Vincent Q Nguyen
(74) *Attorney, Agent, or Firm* — Weaver Austin Villeneuve & Sampson LLP

(57) ABSTRACT

A test wafer having two spaced-apart accelerometers mounted thereon is disclosed. The accelerometers may be positioned at locations located along a common axis passing through the center of gravity of the test wafer. The test wafer may include a controller that may be used to transmit acceleration data collected by the accelerometers to another device. In some implementations, a semiconductor processing tool is provided that includes a test wafer receptacle for storing a test wafer that remains with the semiconductor processing tool and that may be retrieved by a wafer handling robot for performing a test cycle during periods when the wafer handling robot is not performing substrate transport operations.

20 Claims, 11 Drawing Sheets

(56) References Cited

U.S. PATENT DOCUMENTS

| | | |
|---|---|---|
| 7,757,574 B2 | 7/2010 | Renken et al. |
| 7,778,793 B2 | 8/2010 | Bonciolini et al. |
| 7,819,033 B2 | 10/2010 | Renken et al. |
| 7,855,549 B2 | 12/2010 | Renken et al. |
| 2005/0224899 A1 | 10/2005 | Ramsey et al. |
| 2005/0246124 A1 | 11/2005 | Tomer et al. |
| 2005/0246127 A1 | 11/2005 | Renken et al. |
| 2005/0288893 A1 | 12/2005 | Gassner |
| 2007/0113652 A1 | 5/2007 | Renken |
| 2008/0228430 A1 | 9/2008 | Bonciolini et al. |
| 2013/0090881 A1* | 4/2013 | Janardhanan ........ G01C 22/006 702/104 |
| 2015/0214091 A1* | 7/2015 | Rodnick ........... H01L 21/68707 700/228 |

OTHER PUBLICATIONS

"New Product: Automated mechanical monitoring system from InnerSense prevents wafer handling issues," FabTech, Oct. 22, 2009, 2 pgs.

"Wafer Handling Monitor," InnerSense, downloaded Jan. 6, 2017, 1 pg.

"WaferSense ALS2 Vertical Theory of Operation," CyberOptics Semiconductor, 2014, 2 pgs.

"WaferSense Auto Leveling System 2 Vertical (ALS2V)," CyberOptics, 2016, 2 pgs.

"WaferSense Auto Multi Sensor (AMS)," CyberOptics, 2016, 2 pgs.

* cited by examiner

SMART VIBRATION WAFER WITH OPTIONAL INTEGRATION WITH SEMICONDUCTOR PROCESSING TOOL

BACKGROUND

During semiconductor processing of substrates, it is necessary to transport substrates into and out of semiconductor processing chambers, which is typically done with a wafer handling robot of some type. As used herein, the terms "wafer" and "substrate" are used interchangeably and may be used to refer to semiconductor or glass substrates. A typical wafer handling robot may have a multi-joint arm that is configured to independently extend, retract, rotate and, in many cases, raise and lower so as to transport substrates between one or more semiconductor processing chambers, or a loadlock of a transfer chamber leading to one or more semiconductor processing chambers, and one or more load ports or load stations. Such a wafer handling robot may include a thin, blade- or spatula-like end effector that may be positioned beneath a substrate and that has a plurality of contact pads or other points configured to contact the underside or edge of the substrate when the end effector is raised up into contact with the substrate. The end effector is typically designed to only contact the substrate at these locations to reduce the amount of contact between the end effector and the substrate, thereby lessening the opportunities for particulate generation and damage to the substrate.

A typical semiconductor processing tool may be designed to process large numbers of substrates, with multiple substrates being moved through the tool simultaneously. For example, many semiconductor processing tools include a plurality of semiconductor processing chambers arrayed around a central hub, which may be referred to as a transfer chamber. Each semiconductor processing chamber may be connected to the transfer chamber by way of a gate valve or slit door interface that allows that semiconductor processing chamber to be sealed off from the transfer chamber. A vacuum-side wafer handling robot may be located within the transfer chamber and configured to move substrates between the various attached semiconductor processing chambers.

The transfer chamber may also be connected with one or more load locks, which may serve as airlocks that separate the transfer chamber (and the semiconductor processing chambers) from the ambient environment of the processing facility in which the semiconductor processing tool is located. The load locks allow the transfer chamber (and the semiconductor processing chambers) to be operated at a very lower pressure, e.g., in the milliTorr range, continuously while still allowing substrates to enter and exit the transfer chamber from the ambient environment.

The load locks may be connected with an equipment front end module (EFEM), which is a large, typically enclosed structure that may include an atmospheric-side wafer handling robot. The EFEM may also include one or more load ports, which are interfaces through which substrates may enter and exit the EFEM as part of the flow of substrates through the semiconductor processing facility housing the EFEM. The atmospheric-side wafer handling robot may be configured to transfer substrates between the load port(s) and the load lock(s).

In a typical semiconductor processing facility, the movement of substrates between semiconductor processing tools is accomplished through the use of front-opening unified pods (FOUPs), which are sealable containers with vertically-arranged shelves for supporting a large number, e.g., 25 or 30, substrates at a time. A FOUP may be docked at an EFEM load station, and the substrates contained therein may be removed from the FOUP by the atmospheric-side wafer handling robot and transferred to the load lock for retrieval by the vacuum-side wafer handling robot and transfer to/between the semiconductor processing chambers. At the conclusion of the semiconductor processing operations involving a particular substrate, the substrate may be removed from the transfer chamber and returned to the FOUP or to another FOUP in a similar manner.

As is evident, there may be multiple periods of time while a substrate is resident within a particular semiconductor processing tool in which the substrate may be moved about the semiconductor processing tool by a wafer handling robot. Typically, it is desirable to perform such wafer transport operations as quickly as possible since time spent transporting substrates is time during which the substrate is not subject to actual semiconductor processing operations. In semiconductor processing operations, through-put is of paramount importance, and semiconductor processing tools are typically configured to minimize (or reduce) the total amount of time that any given substrate spends within the semiconductor processing tool.

Thus, while wafer handling robots typically move quite quickly, they are typically controlled so as to avoid exposing the substrates that they transport to more than a predetermined level of acceleration to avoid causing the substrates to overcome the friction forces that hold them in position on the end effector contact pads. If the accelerations experienced by a substrate are too great and overcome the contact pad friction forces, the substrate may slip and become misaligned or may, in a worst case, fall off the end effector, resulting in loss of the substrate.

Commercial products exist that allow measurement of the accelerations experienced by a substrate during wafer handling operations. Such products typically take the form of a test wafer having a single tri-axial accelerometer and configured to report out wafer center accelerations in the X- and Y-directions.

SUMMARY

The systems, methods and devices of the disclosure each have several innovative aspects, no single one of which is solely responsible for the desirable attributes disclosed herein. One innovative aspect of the subject matter described in this disclosure can be implemented in a variety of ways.

The present inventors determined that existing, commercially available test wafer systems did not offer accurate feedback regarding the accelerations experienced by substrates during wafer handling operations since such existing test wafer systems could not account for rotation of the substrate about the substrate center of gravity since such existing test wafer systems only utilized a single tri-axial accelerometer nominally located at the substrate center of gravity. The present inventors determined that while the vast bulk of the acceleration experienced by a substrate during wafer transport operations may be attributable to movement of the substrate other than rotation of the substrate about its center of gravity, rotation of the substrate about its center of gravity can contribute to the acceleration magnitudes of the substrate and can therefore contribute to the forces that act on the substrate during movement and that may cause the friction force interface between the substrate and the end effector contact pads to be overcome.

The present inventors also conceived of a more integrated relationship between a test wafer and a semiconductor processing tool. Typical commercially available test wafers are often configured to be stand-alone test or diagnostic systems that are self-contained and that collect data regarding the environment through which a substrate passes during transit of an entire wafer processing regimen. For example, some commercially available test wafers come with specially designed FOUPs that allow the test wafers to be moved through multiple semiconductor processing tools in the same manner as a normal substrate. These FOUPs may include charging systems and data storage systems that recharge the test wafer and retrieve data from the test wafer when the test wafer is docked in the FOUP. In some implementations of the test wafer discussed herein, the test wafer may be "resident" in a particular semiconductor processing tool, and may remain there even when not in use. In such implementations, the semiconductor processing tool may have a special receptacle or holder to hold the test wafer when the test wafer is not being used. The semiconductor processing tool may also be programmed to periodically retrieve the test wafer from the receptacle and perform a test cycle using the test wafer.

These and other features of the implementations discussed herein are described in this specification are set forth in the accompanying drawings and the description below. Other features, aspects, and advantages will become apparent from the description, the drawings, and the claims.

In some implementations, an apparatus may be provided that includes a platform sized to be carried by an end effector of a wafer handling robot in a semiconductor processing tool. The apparatus may also include a first accelerometer, a second accelerometer, a power source, a communications interface, and a controller including one or more processors and a memory operably connected with the one or more processors. The controller may be operably connected with the power source, the communications interface, the first accelerometer, and the second accelerometer. The first accelerometer and the second accelerometer may be positioned on the platform at spaced-apart locations along a common axis that crosses the center of gravity of the apparatus when viewed along a direction perpendicular to the platform. The memory may store computer-executable instructions for controlling the one or more processors to obtain acceleration data from the first accelerometer and the second accelerometer and transmit the acceleration data via the communications interface.

In some such implementations, the first accelerometer and the second accelerometer may be biaxial or triaxial accelerometers.

In some implementations, the acceleration data may include data from the first accelerometer indicative of magnitudes of acceleration along a first axis of the first accelerometer parallel to the common axis and a second axis of the first accelerometer perpendicular to the first axis, as well as data from the second accelerometer indicative of magnitudes of acceleration along a first axis of the second accelerometer parallel to the common axis and a second axis of the second accelerometer perpendicular to the first axis. In such implementations, the memory may further store computer-executable instructions for controlling the one or more processors to determine rotational acceleration in the plane of the platform about the center of gravity of the apparatus using the acceleration data.

In some implementations, the computer-executable instructions for controlling the one or more processors to determine rotational acceleration in the plane of the platform about the center of gravity of the apparatus using the acceleration data may include instructions for controlling the one or more processors to: determine a CG acceleration magnitude at the center of gravity of the apparatus and along an axis parallel to the second axes, determine a first tangential acceleration magnitude, at least in part, by subtracting the CG acceleration magnitude from the magnitude of acceleration along the second axis for the first accelerometer, and determine the rotational acceleration using at least the first tangential acceleration magnitude and a distance between the first accelerometer and the center of gravity of the apparatus in the plane of the apparatus.

In some such implementations, the apparatus may further include a third accelerometer positioned on the platform and located at the center of gravity of the apparatus. In such implementations, the acceleration data may further include data from the third accelerometer indicative of a magnitude of acceleration along an axis parallel to the second axis of the first accelerometer, and the instructions for controlling the one or more processors to determine the CG acceleration magnitude may cause the one or more processors to use the magnitude of acceleration from the third accelerometer and along the axis parallel to the second axis of the first accelerometer as the CG acceleration magnitude. In alternative or additional such implementations, the first accelerometer and the second accelerometer may be equidistantly spaced from the center of gravity of the apparatus, and the instructions for controlling the one or more processors to determine the CG acceleration magnitude may cause the one or more processors to average the magnitudes of acceleration along the second axes for the first accelerometer and the second accelerometer to obtain the CG acceleration magnitude.

In some implementations of the apparatus, the computer-executable instructions for controlling the one or more processors to determine rotational acceleration in the plane of the platform about the center of gravity of the apparatus using the acceleration data may include further instructions causing the one or more processors to: determine a second tangential acceleration magnitude, at least in part, by subtracting the CG acceleration magnitude from the magnitude of acceleration along the second axis for the second accelerometer, and determine the rotational acceleration using at least the first tangential acceleration magnitude, the distance between the first accelerometer and the center of gravity of the apparatus in the plane of the apparatus, the second tangential acceleration magnitude, and a distance between the second accelerometer and the center of gravity of the apparatus in the plane of the apparatus.

In some implementations of the apparatus, the acceleration data may include data for the first accelerometer indicative of magnitudes of acceleration along a first axis of the first accelerometer parallel to the common axis and a second axis of the first accelerometer perpendicular to the first axis, as well as data for the second accelerometer indicative of magnitudes of acceleration along a first axis of the second accelerometer parallel to the common axis and a second axis of the second accelerometer perpendicular to the first axis. In such implementations, the first accelerometer and the second accelerometer may be equidistantly spaced from the center of gravity of the apparatus, and the computer-executable instructions may include instructions for controlling the one or more processors to determine a first CG acceleration magnitude along a first CG axis parallel to the first axes and at the center of gravity of the apparatus by averaging the magnitudes of acceleration along the first axes of the first accelerometer and the second accelerometer and to determine a second CG acceleration magnitude along a second CG axis parallel to the second axes at the center of gravity of the apparatus by averaging the magnitudes of acceleration along the second axes of the first accelerometer and the second accelerometer.

In some implementations of the apparatus, the acceleration data may include data for the first accelerometer indicative of magnitudes of acceleration along a first axis of the first accelerometer parallel to the common axis and a second axis of the first accelerometer perpendicular to the first axis, as well as data for the second accelerometer indicative of magnitudes of acceleration along a first axis of the second accelerometer parallel to the common axis and a second axis of the second accelerometer perpendicular to the first axis. In such implementations, the first accelerometer may be positioned a first distance away from the center of gravity of the apparatus and the second accelerometer may be positioned a second distance away from the center of gravity of the apparatus such that the center of gravity of the apparatus is between the first accelerometer and the second accelerometer, and the computer-executable instructions may include instructions for controlling the one or more processors to determine a first CG acceleration magnitude along a first CG axis parallel to the first axes and at the center of gravity of the apparatus by dividing the sum of the first distance times the magnitude of acceleration along the first axis for the second accelerometer and the second distance times the magnitude of acceleration along the first axis for the first accelerometer by the sum of the first distance and the second distance, and determine a second CG acceleration magnitude along a second CG axis parallel to the second axes and at the center of gravity of the apparatus by dividing the sum of the first distance times the magnitude of acceleration along the second axis for the second accelerometer and the second distance times the magnitude of acceleration along the second axis for the first accelerometer by the sum of the first distance and the second distance.

In some implementations of the apparatus, the apparatus may further include a third accelerometer positioned on the platform and located at the center of gravity of the apparatus. In such implementations, the computer-executable instructions may further include instructions for controlling the one or more processors to obtain CG acceleration data from the third accelerometer, compare a magnitude of acceleration for the third accelerometer along an axis parallel to the first axes of the first and second accelerometers against the first CG acceleration magnitude to determine a first acceleration delta, compare a magnitude of acceleration for the third accelerometer along an axis parallel to the second axes of the first and second accelerometers against the second CG acceleration magnitude to determine a second acceleration delta, determine whether an error condition exists by comparing at least one item selected from the group consisting of: the first acceleration delta, the second acceleration delta, and the first acceleration delta and the second acceleration delta against a first threshold, and cause the communications interface to transmit a first error code signal responsive to a determination that the error condition exists.

In some such implementations, the computer-executable instructions may further include instructions for controlling the one or more processors to determine a CG acceleration magnitude at the center of gravity of the apparatus and along an axis parallel to the second axes of the first and second accelerometers, determine a first tangential acceleration magnitude, at least in part, by subtracting the CG acceleration magnitude from the magnitude of acceleration along the second axis for the first accelerometer, determine a second tangential acceleration magnitude, at least in part, by subtracting the CG acceleration magnitude from the magnitude of acceleration along the second axis for the second accelerometer, compare the first tangential acceleration magnitude to the second tangential acceleration magnitude to determine a) whether the first tangential acceleration magnitude is opposite in direction to the second tangential acceleration magnitude and b) whether the absolute magnitude of the first tangential acceleration magnitude and the absolute magnitude of the second tangential acceleration magnitude are within a second threshold amount of one another, and cause the communications interface to transmit a second error code signal responsive to either or both of a) or b) not being met.

In some implementations, an apparatus may be provided that may include an equipment front end module (EFEM) having one or more load ports each configured to receive a front-opening unified pod (FOUP) containing one or more substrates having a nominal substrate size; one or more semiconductor processing chambers; a load lock interposed between the EFEM and the one or more semiconductor processing chambers; a test wafer receptacle sized to receive a test wafer of the nominal substrate size, the test wafer receptacle located in a location selected from the group consisting of: within the EFEM and adjacent the EFEM; a wafer handling robot located in the EFEM and having an end effector configured to transport wafers between the one or more load ports and the load lock; and a tool controller having one or more processors and a memory operably connected with the one or more processors. The tool controller may be operably connected with the wafer handling robot and the memory may store computer-executable instructions for controlling the one or more processors of the tool controller to: cause the one or more semiconductor processing chambers to perform one or more semiconductor processing operations on substrates placed into the one or more semiconductor processing chambers, cause the wafer handling robot to transport substrates between the one or more load ports and the load lock according to a schedule driven by the semiconductor processing operations performed on the substrates, and cause the wafer handling robot to perform a test cycle during a test interval selected such that the transport of substrates between the one or more load ports and the load lock is not interrupted by the test cycle. The test cycle may include retrieving a test wafer from the test wafer receptacle, performing a diagnostic test with the test wafer, and returning the test wafer to the test wafer receptacle.

In some such implementations of the apparatus, the apparatus may further include the test wafer. The test wafer may include a platform sized to be carried by the end effector of the wafer handling robot and to fit within a horizontal envelope defined by a nominal outer perimeter of the substrates; a first accelerometer; a second accelerometer; a power source; a communications interface; and a test wafer controller including one or more second processors and a second memory operably connected with the one or more second processors. The test wafer controller may be operably connected with the power source, the communications interface, the first accelerometer, and the second accelerometer, and the first accelerometer and the second accelerometer may be positioned on the platform at spaced-apart locations along a common axis that crosses the center of gravity of the test wafer when viewed along a direction perpendicular to the platform. The second memory may store computer-executable instructions for controlling the one or more second processors to obtain acceleration data from the first accelerometer and the second accelerometer and transmit the acceleration data via the communications interface to the tool controller.

In some implementations, the test wafer receptacle may be fixed with respect to the EFEM.

In some implementations, the test cycle may further include performing an accelerometer calibration check on the test wafer by comparing data derived from at least one accelerometer on the test wafer against data derived from at least one other accelerometer on the test wafer.

In some implementations of the apparatus, the test wafer receptacle may be located adjacent the EFEM and may be connected with the EFEM by an opening sized to allow the test wafer to be inserted into the test wafer receptacle from the EFEM.

In some implementations of the apparatus, the EFEM may have a substantially rectangular interior volume when viewed from a direction perpendicular to the substrates, and the test wafer receptacle may be positioned in one of the corners of the rectangular interior volume.

In some implementations of the apparatus, the memory may store computer-executable instructions for controlling the one or more processors of the tool controller to cause the wafer handling robot to perform one or more motions associated with the test cycle during the test cycle, receive data collected by one or more accelerometers on the test wafer during the test cycle, determine whether the data collected by the one or more accelerometers on the test wafer passes a test condition involving one or more criteria associated with the one or more motions, and generate an error condition signal responsive to determining that the data collected by the one or more accelerometers fails to pass the test condition.

In some such implementations of the apparatus, the error condition signal may include information indicating that the wafer handling robot requires servicing.

In some implementations of the apparatus, the memory may further store computer-executable instructions for controlling the one or more processors of the tool controller to periodically perform the test cycle on a recurring basis according to a baseline schedule.

The above is not an exhaustive list of the implementations disclosed herein, and it is to be understood that various other implementations will be apparent from the following discussion, and that such other implementations are also considered to be within the scope of this disclosure.

DRAWINGS

DETAILED DESCRIPTION

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations have not been described in detail in order not to unnecessarily obscure the present invention.

Figure 1:
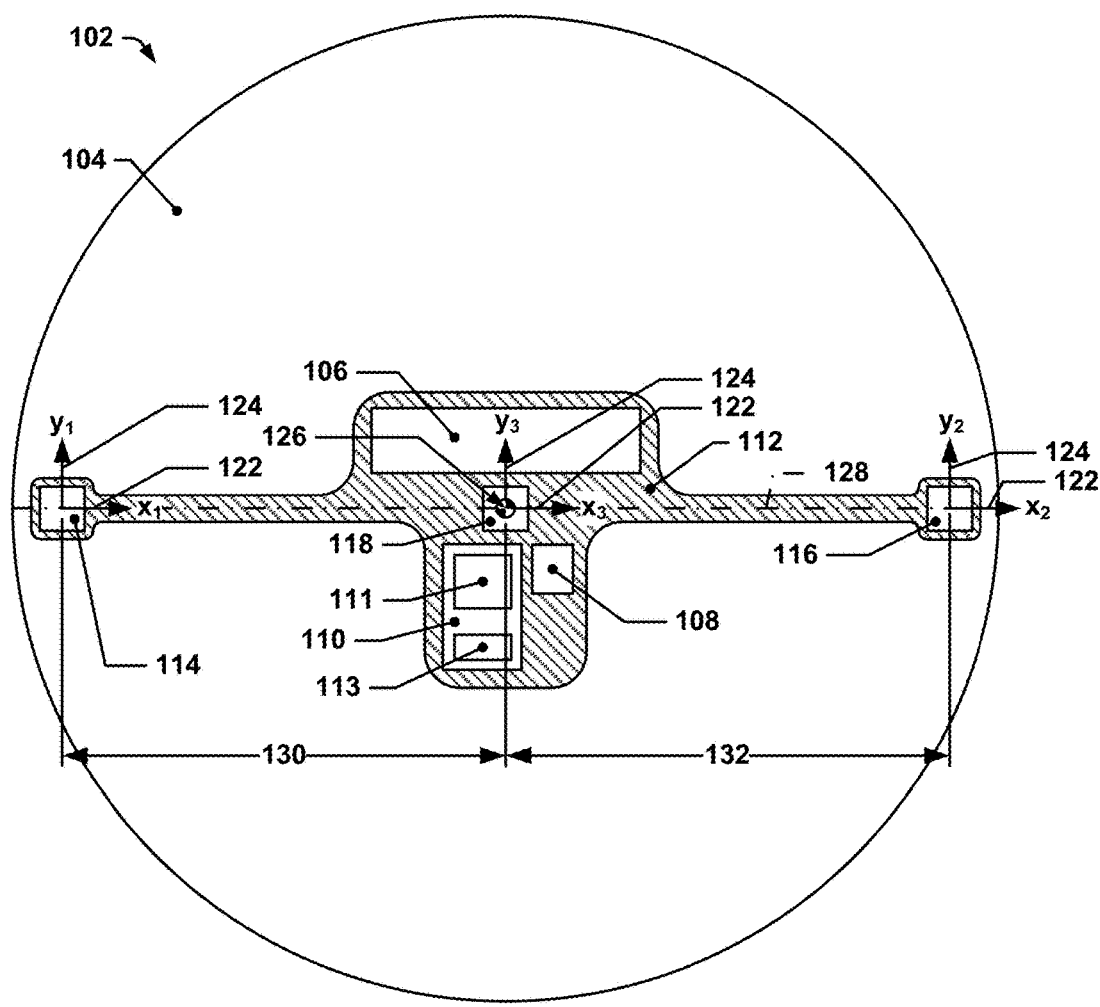
FIG. 1 depicts a plan view of an example test wafer.
Figure 2:
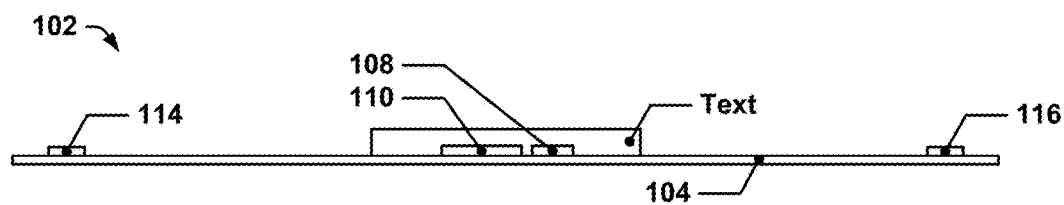
FIG. 2 depicts a side view of the same example test wafer.

FIG. 1 depicts a plan view of an example test wafer. FIG. 2 depicts a side view of the same example test wafer. In FIG. 1, a test wafer 102 may have a printed circuit 112 that links a controller 110, a power source 106, a communications interface 108, a first accelerometer 114, and a second accelerometer 116. The controller 110 may include one or more processors 111 and a memory 113 that stores computer executable instructions for controlling the one or more processors to use the power source 106, the first accelerometer 114, the second accelerometer 116, and the communications interface 108 to perform various functions, as is discussed in more detail later herein. In some implementations, an optional third accelerometer 118 may also be included and located at the center-of-gravity (CG) 126 of the test wafer 102. The test wafer 102 may also include a platform 104 which may be sized so as to be capable of being transported in the same manner as a standard-sized semiconductor wafer in a semiconductor processing tool. For example, the platform may be a 300 mm diameter disk and be configured to be transported within a semiconductor processing tool sized to process 300 mm diameter substrates. It will be understood that the platform 104 may not exactly match the standard-sized semiconductor wafers in shape, although the platform may be sized to at least interface with the end effector of the wafer handling robot in the same manner as the standard-sized semiconductor wafer. For example, the platform may have one or more cutouts in its perimeter to adjust the mass distribution of the test wafer so that it more closely aligns with that of a standard-sized semiconductor wafer.

In contrast with commercially available test wafers, the test wafer 102 includes multiple accelerometers, including at least two accelerometers—the first accelerometer 114 and the second accelerometer 116, for example—that are offset from the CG 126 of the test wafer 102. As used herein, an "accelerometer" refers to a plurality of accelerometers that are associated with one another and configured to provide acceleration data regarding a common point in space. For example, tri-axial accelerometers are commercially available that technically include three single-axis accelerometers that are configured to provide acceleration data along three nominally orthogonal axes that nominally pass through a common point. These three single-axis accelerometers would, per the convention used herein, be viewed as a single "accelerometer" because they are configured to provide acceleration data regarding a common point. Conversely, these three single-axis accelerometers would not, per the convention used herein, be viewed as three separate accelerometers since these three accelerometers are designed to work in concert to provide acceleration data about a single point in space. Thus, the first accelerometer and the second accelerometer may be provided as biaxial accelerometers or tri-axial accelerometers. If biaxial accelerometers are used, then the accelerometers may be mounted such that the XY plane of the biaxial accelerometers is parallel to the platform.

In various implementations, the first accelerometer 114 and the second accelerometer 116 may be mounted to a printed circuit board or flexible printed circuit 112, which may include conductive traces for providing power and signal between the controller 110, the power source 106, the communications interface 108, the first accelerometer 114, the second accelerometer 116, and, if present, the third accelerometer 118. In some implementations, the printed circuit 112 may include an induction coil or other conductive circuit trace that may be used to allow the power source 106, which may, for example, be a rechargeable battery, to be recharged.

The first accelerometer 114 and the second accelerometer 116 may both be positioned such that the points for which each accelerometer collects acceleration data lie along a common axis 128 that passes through the test wafer CG 126. Moreover, the first accelerometer 114 and the second accelerometer 116 may also be configured such that acceleration magnitudes along first axes 122 and along second axes 124 perpendicular to the first axes 122 may be obtained from the first accelerometer 114 and the second accelerometer 116. For example, in the depicted implementation, the x-axes, which may be thought of as the first axes 122, of the first accelerometer 114 and the second accelerometer 116 are coincident with the common axis 128, whereas the y-axes, which may be thought of as the second axes 124, of the first accelerometer 114 and the second accelerometer 116 are oriented in a direction that is in-plane with the platform 104 and perpendicular to the first axes 122.

It will be understood that it is, of course, possible to rotate an accelerometer to any desired orientation, collect data in that orientation, and then transform the collected data so that it is expressed in the context of any other desired orientation (for a biaxial accelerometer configuration, it is possible to re-orient the accelerometer to any orientation and do this as long as the first axis and the second axis, e.g., the x-axis and the y-axis, of that accelerometer remain in-plane with one another; in a tri-axial accelerometer configuration, the accelerometer may be rotated to any orientation). In view of this, it is to be further understood that data from an accelerometer may still be indicative of magnitudes of acceleration along axes other than the primary axes of the accelerometer—for example, if an accelerometer is mounted on the platform 104 such that the accelerometer x-axis is oriented at a 45° to the common axis, the acceleration data that is output will still be indicative (although a coordinate system transform may need to be applied) of the acceleration magnitude along a first axis 122 that is parallel to the common axis 128 and a second axis 124 that is perpendicular to the common axis 128.

In implementations where a third accelerometer 118 is also used, the third accelerometer 118 may be located at the CG 126; similarly to the first accelerometer 114 and the second accelerometer 116, the third accelerometer 118 may be positioned such that the point for which the third accelerometer 118 collects acceleration data lies along the common axis 128. Moreover, the third accelerometer 118 may also be configured such that acceleration magnitudes along a first axis 122 (which may also be referred to herein as a first CG axis) and along a second axis 124 (which may also be referred to herein as a second CG axis) perpendicular to the first axis 122 may be obtained from the third accelerometer 118.

For ease of discussion, the first accelerometer 114, the second accelerometer 116, and the third accelerometer 118 are shown with the x-axes $x_1$, $x_2$, and $x_3$, respectively, aligned with the common axis 128, and with the y-axes, $y_1$, $y_2$, and $y_3$, respectively, perpendicular to the common axis 128, so that the principal axes of the accelerometers are lined up with the first axes 122 and the second axes 124.

As shown in FIG. 1, the first accelerometer 114 and the second accelerometer 116 may be spaced apart from the CG 126 along the common axis by a first distance 130 and a second distance 132, respectively. If the first distance 130 and the second distance 132 are equal, as depicted in this example, then pure rotational motion of the test wafer 102 about the CG 126 will result in the generation of equal and opposite magnitudes of acceleration by the first accelerometer 114 and the second accelerometer 116 with respect to the first axes 122. Similarly, during periods in which such rotational motion of the test wafer 102 is increasing or decreasing, i.e., the angular acceleration of the test wafer 102 is varying, the first accelerometer 114 and the second accelerometer 116 will produce equal and opposite magnitudes of acceleration along the second axes 124. In some implementations, the first distance 130 and the second distance 132 may be different, in which case the accelerations along the first axes 122 for the first accelerometer 114 and the second accelerometer 116 may be proportional to each other in the same ratio that the first distance 130 and the second distance 132 are; a similar observation may be made with respect to the accelerations along the second axes 124 for the first accelerometer 114 and the second accelerometer 116.

A test wafer such as is depicted in FIG. 1 may be used to collect more reliable data regarding the acceleration environment that a substrate is subjected to as it undergoes wafer handling than may be collected by a single-accelerometer test wafer, such as various commercially available test wafers.

Figure 3:
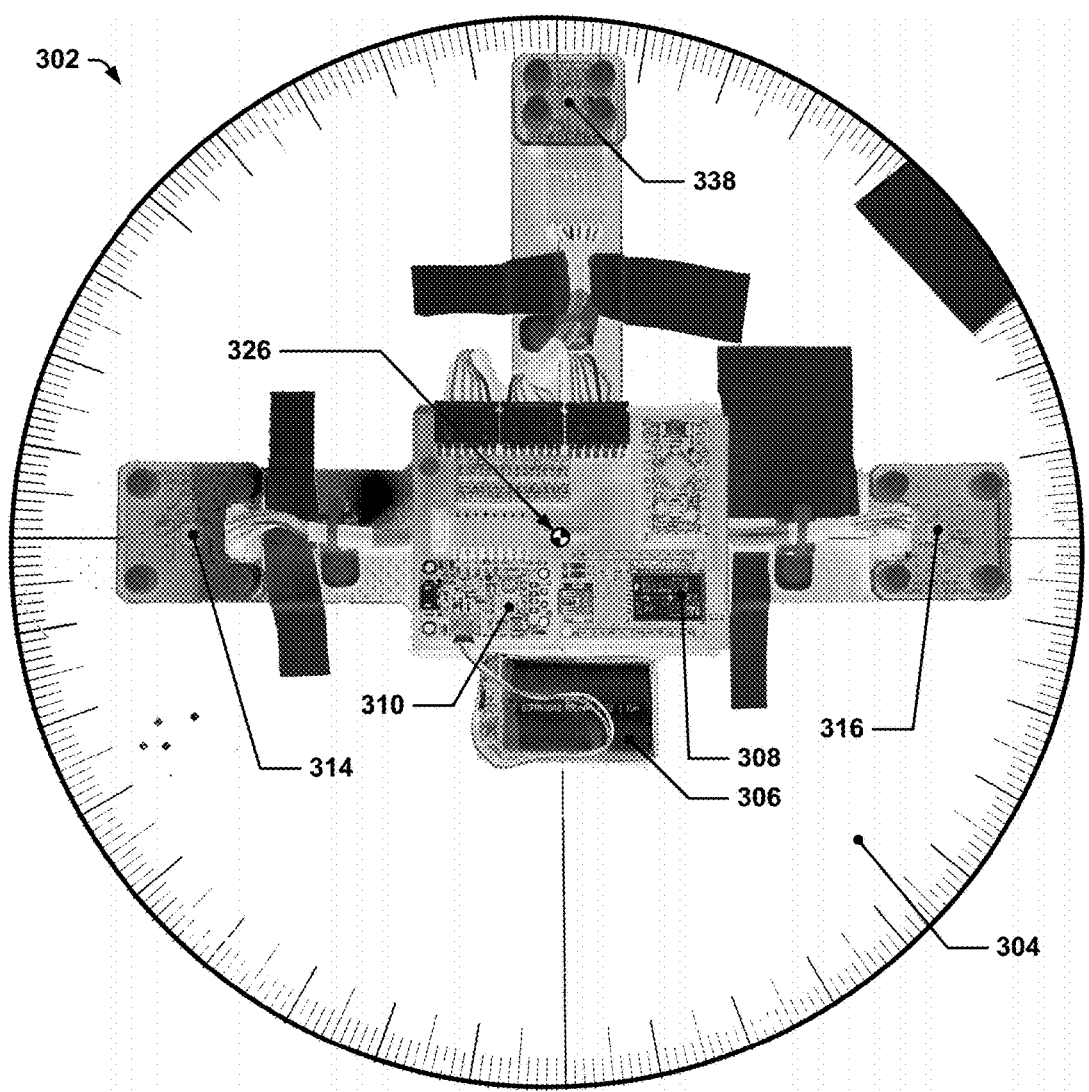
FIG. 3 depicts a photograph of an example test wafer prototype.

FIG. 3 depicts a photograph of an example test wafer prototype 302 with a first accelerometer 314 and a second accelerometer 316 that are located with equidistant spacing from the example test wafer CG 326. A power source 306, communications interface 308, and a controller 310 are also depicted. All of these components are mounted to a platform 304, which, in this case, is a carbon fiber disk, and are distributed so that the example test wafer prototype 302 has a CG 326 that is nominally the same as for a standard-sized substrate of similar size (in this example, the standard-sized substrate is a 300 mm diameter substrate). The test wafer prototype also includes an optional gyroscope 338, which may be used to provide an alternate or additional means for evaluating the rotational motion of the test wafer prototype. It is to be understood that in various further implementations, the various electronic components, e.g., the controller, the communications interface, and the accelerometers, may be mounted to a flexible substrate, e.g., a flexible printed circuit, that is then bonded to the platform to produce a low-profile, highly integrated test wafer package. The power source may be separately connected to the flex circuit after it is mounted to the platform, or may be integrated into the flex circuit as well. In some implementations, the platform itself may have a printed circuit that is formed within or on the layers of a composite that forms the platform. In such cases, the accelerometers, controller, communications interface, and power source may be surface mounted directly to the platform.

The inclusion of at least two accelerometers, such as the first accelerometer 114 or 314 and the second accelerometer 116 or 316, enables certain functionality that is not possible with existing, commercially available, single-accelerometer test wafers. This additional functionality may be provided on-board the test wafer, e.g., by the controller 110 or 310, or may be provided remotely, e.g., by a controller or processor that is supplied with data from the test wafer, e.g., data that is transmitted from the test wafer to another device using the communications interface 108. Such additional functionality is discussed below with respect to the implementation of FIG. 1, but may also be implemented, of course, with the prototype test wafer 302.

Figure 4:
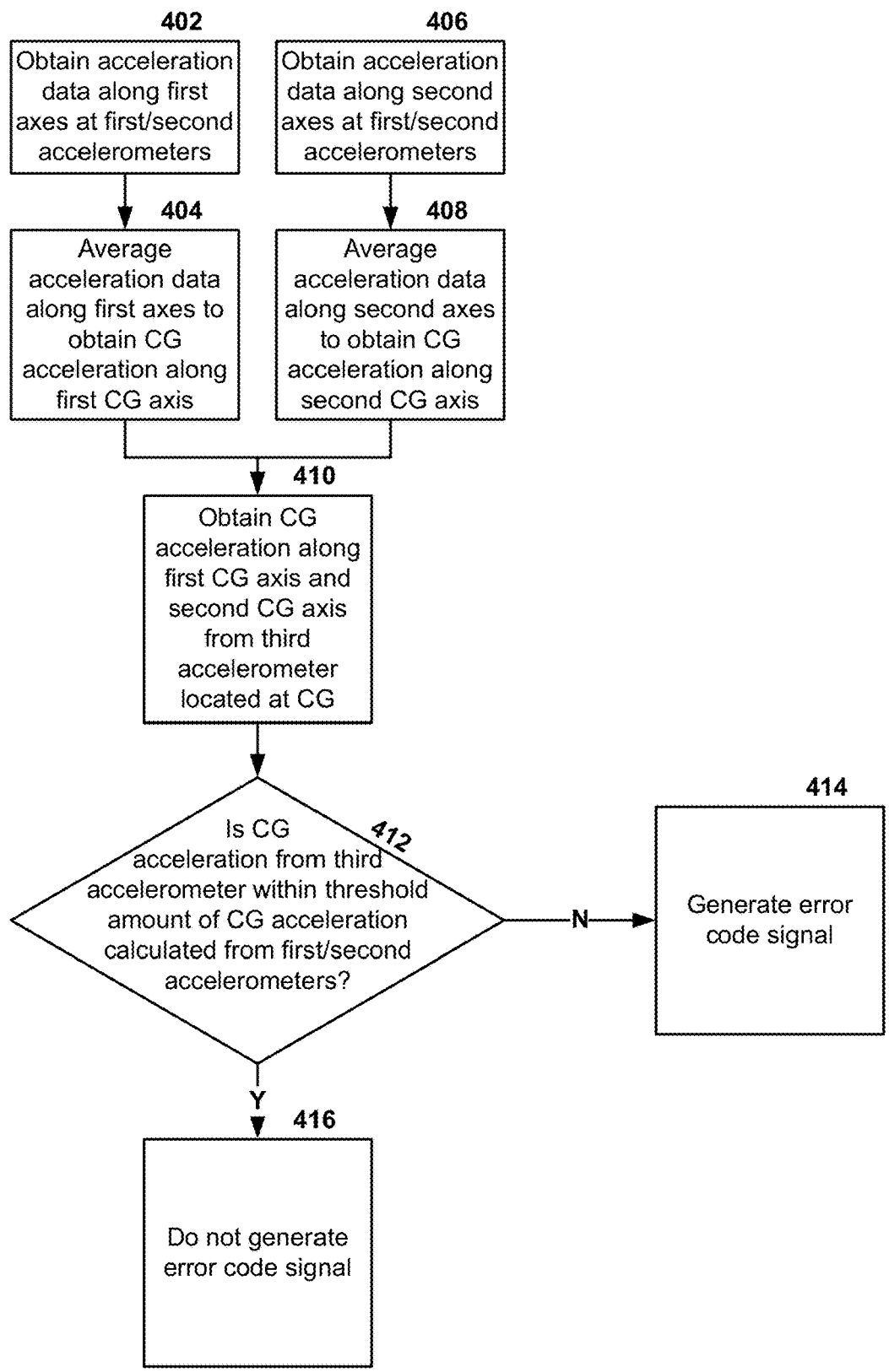
FIG. 4 depicts a flow chart of a technique for estimating accelerations at the CG of a test wafer.

One additional function that may be enabled through the use of the first accelerometer 114 and the second accelerometer 116 is the calculation of acceleration magnitudes at the CG 126—even if no accelerometer is present at the CG 126. FIG. 4 depicts a flow chart of such a technique that may be used for test wafers with first and second accelerometers that are equidistantly spaced from the center of gravity of the test wafer. For example, in block 402, the acceleration magnitudes from the first accelerometer 114 and the second accelerometer 116 along the first axes 122 may be obtained and, in block 404, averaged to determine the acceleration along an axis at the CG 126 parallel to the first axes 122; this axis at the CG 126 may be referred to as a first CG axis herein. Similarly, in the case where the first accelerometer 114 and the second accelerometer 116 are equidistantly spaced from the CG 126 or 326, the acceleration magnitudes from the first accelerometer 114 and the second accelerometer 116 along the second axes 124 may be obtained in block 406 and averaged in block 408 to determine the acceleration along an axis at the CG 126 and parallel to the second axes 124; this axis at the CG 126 may be referred to herein as the second CG axis. If the first accelerometer 114 and the second accelerometer 116 are not equidistantly spaced from the CG 126, however, the acceleration magnitudes along the first axes 122 and the second axes 124 may be appropriately scaled based on the ratios of the first distance 130 and the second distance 132 during calculation of the acceleration magnitudes at the CG 126. For example, the acceleration magnitudes along axes parallel to the first and second axes at the CG 126 may be calculated by using the equations:

$$a_{x_{CG}} = \frac{d_1 a_{x_2} + d_2 a_{x_1}}{d_1 + d_2}$$

$$a_{y_{CG}} = \frac{d_1 a_{y_2} + d_2 a_{y_1}}{d_1 + d_2}$$

where $a_{y,1}$=acceleration along second axis at first accelerometer, $a_{y,2}$=acceleration along second axis at second accelerometer, $d_1$=first distance 130, and $d_2$=second distance 132 (assumes coordinate systems of both accelerometers are oriented in the same direction).

Once the accelerations at the CG along axes parallel to the first axes 122 and the second axes 124 have been determined based on data from the first accelerometer 114 and the second accelerometer 116, such accelerations may, in some implementations, be compared against acceleration data from the optional third accelerometer 118 (if present) (the technique of FIG. 4 may, in some implementations, be stopped after blocks 404/408 if it is not desired to check the calculated CG accelerations against the data from a third accelerometer 118). For example, in block 410 acceleration magnitudes along the first CG axis and the second CG axis may be obtained from the third accelerometer 118. This allows the acceleration magnitudes at the center of gravity from two different sensor systems to be compared in block 412—the data measured directly at the CG 126 by the third accelerometer 118 along axes parallel to the first axes 122 and the second axes 124, and the computed acceleration magnitudes derived from the acceleration data from the first accelerometer 114 and the second accelerometer 116. Generally speaking, the acceleration magnitudes from both sources should correlate in time and be identical or similar in magnitude, i.e., the deltas between the acceleration magnitudes for the third accelerometer and the acceleration magnitudes calculated from the acceleration data for the first and second accelerometers should be less than a predetermined amount. Thus, the third accelerometer 118 may be used as a check or validation of the first accelerometer 114 and the second accelerometer 116, and vice versa—if the check or validation fails, then an error code signal may be generated in block 414, e.g., by the controller, indicating that an error condition exists (if the check or validation is passed, then no error code signal may be generated (see block 416). The controller, e.g., of the test wafer or, in systems in which such processing is done off-board of the test wafer, of a remote system such as a wafer handling robot may compare the acceleration magnitudes from the third accelerometer 118 against the acceleration magnitudes calculated from the data obtained from the first accelerometer 114 and the second accelerometer 116. Such comparisons may be done on a per-component basis, e.g., comparing each corresponding acceleration component separately, i.e., checking the acceleration magnitudes along the first axes and then separately checking the acceleration magnitudes along the second axes, or may be done in a more global fashion, e.g., by computing the planar resultant at the CG 126 for each set of CG data. For example, the planar resultant may be determined by taking the square root of the sum of a) the square of the acceleration magnitude at the CG along an axis parallel to the first axes and b) the square of the acceleration magnitude at the CG along an axis parallel to the second axes. A similar calculation may be made for the data from the third accelerometer 118.

Figure 5:
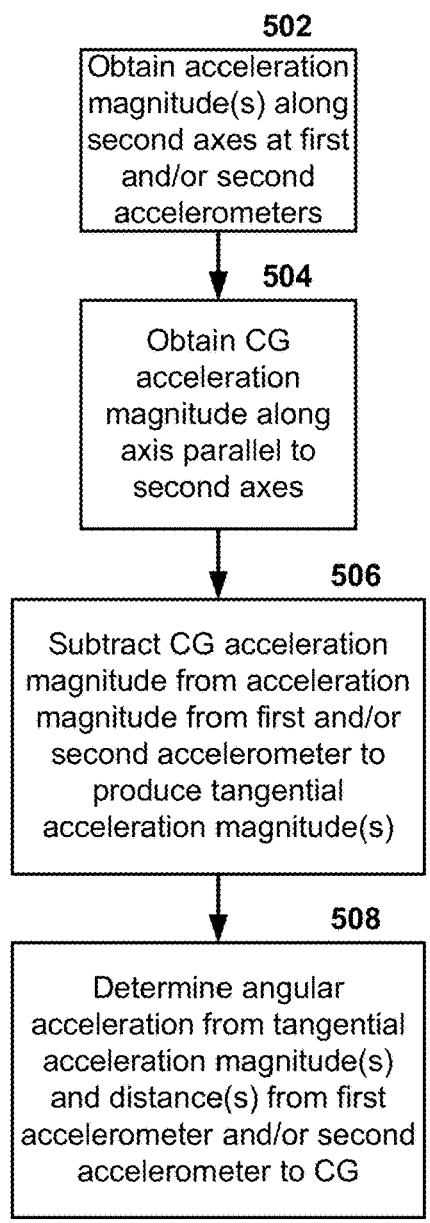
FIG. 5 depicts a flowchart of a technique for determining rotational acceleration about the CG of a test wafer.

Once the acceleration magnitudes at the CG 126 are known, either through calculating them from the acceleration data from the first accelerometer 114 and the second accelerometer 116, obtaining them directly from the third accelerometer 118 (if present), or a combination of both, the rotational acceleration components about the CG 126 associated with movement of the test wafer 102 may be determined. FIG. 5 depicts a flowchart of such a technique. During rotation of the test wafer 102 about the CG 126, both centripetal/radial acceleration along the common axis 128 and tangential acceleration along the second axes may be detected by the first accelerometer 114 and the second accelerometer 116. The tangential acceleration, however, may only arise due to the rotational motion when the rotational acceleration is changing; during constant rotation of the test wafer 102, there will be no resulting tangential acceleration. While some wafer handling robots may be capable of producing pure rotational movement of the test wafer, e.g., wafer handling robots that may be able to position the test wafer with the CG 126 positioned directly over the shoulder joint of the wafer handling robot, in most cases, the acceleration components arising from rotation of the test wafer 102 about the CG 126 may be combined with accelerations arising from translation of the test wafer and from rotation of the test wafer about a location other than the CG 126. These additional acceleration components are applied throughout the test wafer and correspond in magnitude and direction to the acceleration magnitudes at the CG 126 of the test wafer 102. In order to obtain rotational acceleration component data that is not contaminated by the additional acceleration components, the acceleration magnitudes at the CG 126, which may be obtained in block 504, may be subtracted in block 506 from the corresponding acceleration magnitudes derived from the first accelerometer 114 and/or the second accelerometer 116, which may be obtained in block 502.

Thus, for example, if the acceleration magnitude along the second axis 124 at the first accelerometer 114 is 5 units and the acceleration magnitude at the CG 126 along an axis parallel to the second axis 124 at the first accelerometer 114 is −3 units, then the tangential rotational acceleration component about the CG 126 at the first accelerometer 114 would be 5−(−3)=8 units. Once the tangential acceleration component about the CG 126 is known at a particular location, the rotational acceleration about the CG 126 may be determined in block 508 by, for example, dividing that tangential acceleration by the distance between that location and the CG 126, e.g., if the tangential acceleration at the first accelerometer 114 is 8 units, and the distance between the first accelerometer 114 and the CG 126 is 2 units, then the angular or rotational acceleration a would be determined to be 4 units according to the equation:

$$\alpha = \frac{a_t}{d_1}$$

It will be readily apparent that the tangential acceleration component may be determined using the accelerations measured by either the first accelerometer 114 or the second accelerometer 116. In some implementations, the accelerations measured by both the first accelerometer 114 and the second accelerometer 116 may be used to determine tangential accelerations, and the angular accelerations resulting from both tangential accelerations may be averaged to arrive at a more accurate angular acceleration value for the test wafer. Once the angular acceleration is known, the angular acceleration may be used, in conjunction with the acceleration components at the CG 126, to determine the acceleration at any point on the test wafer 102. This allows for more precise determination of the actual acceleration field across the test wafer and, in particular, at the locations where the test wafer 102 contacts the contact pads of the end effector of the wafer handling robot.

Figure 6:
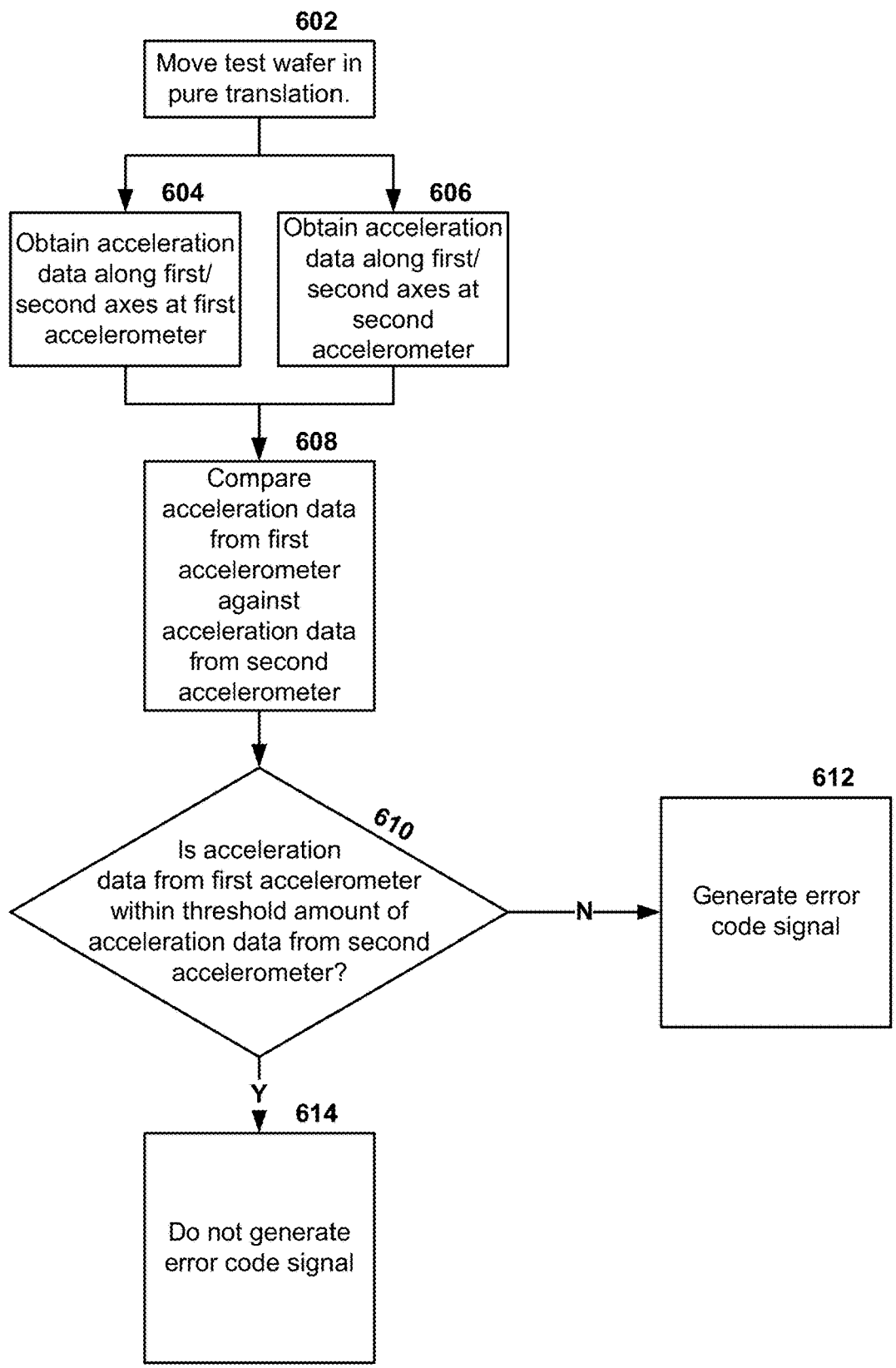
FIG. 6 depicts a flow diagram of a technique for performing a self-check of a test wafer.

In some implementations, multiple accelerometers may be used to provide additional levels of self-check in the test wafer. FIG. 6 depicts a flow diagram for such a technique. For example, in block 602, a robot arm may be caused to extend and retract without any rotation of the test wafer 102 at all while acceleration data along the first and second axes for the first accelerometer and the second accelerometer are obtained in blocks 604 and 606, respectively. In such cases, the acceleration data from the first accelerometer 114, the second accelerometer 116, and the third accelerometer 118 (if used) should be identical, and if the differences in acceleration data between any two of these accelerometers exceeds a particular threshold when compared in block 608, then this may be indicative that one or more of the accelerometers has experienced a fault and that the test wafer should be withdrawn from service, as may be determined in block 610. If a fault is detected, then an error code signal may be generated in block 612; if no fault is detected, then the technique may proceed to block 614 and no error code may be generated.

Figure 7:
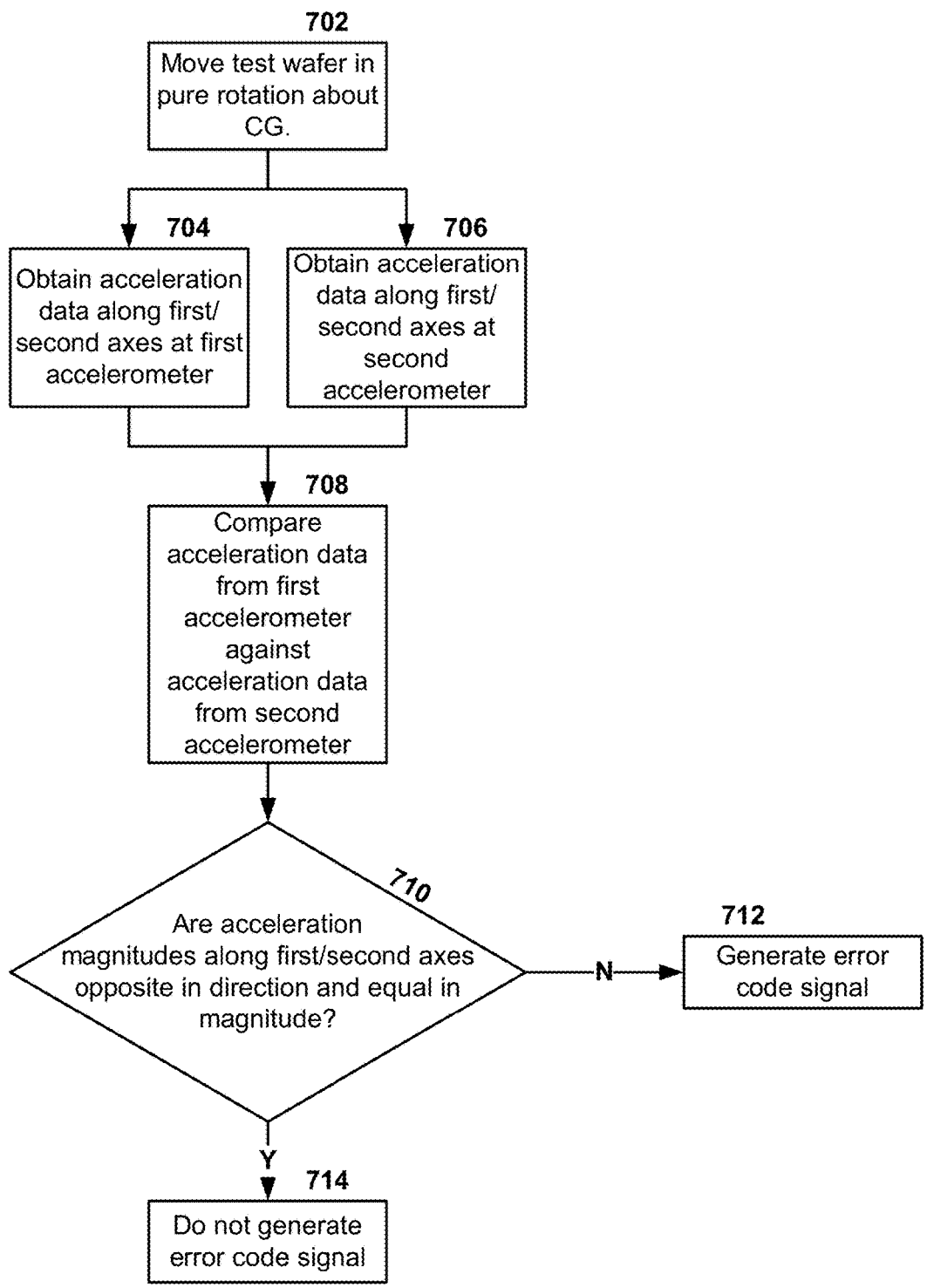
FIG. 7 depicts a flow diagram of technique for performing another self-check of a test wafer.

In some implementations, if the wafer handling robot supports providing pure rotation to the test wafer, e.g., if the wafer handling robot can position the test wafer with the CG 126 directly over the center of rotation of the wafer handling robot, then an additional check may be performed in which the test wafer 102 may be rotated about the CG 126 by the wafer handling robot with no other rotational or translational movement. FIG. 7 depicts a flow diagram of such a technique. In block 702, the test wafer 102 may be rotated about its center in pure rotational movement by the wafer handling robot. In blocks 704 and 706, acceleration data along the first and second axes for the first accelerometer and the second accelerometer, respectively, may be obtained. In block 708, the acceleration data from the first accelerometer and the second accelerometer may be compared. If the first accelerometer 114 and the second accelerometer 116 are equidistantly spaced from the CG 126, this should produce equal and opposite acceleration magnitudes along the first axes and also equal and opposite acceleration magnitudes along the second axes for the first accelerometer 114 and the second accelerometer 116. If the first accelerometer 114 and the second accelerometer 116 are not equidistantly spaced, then the magnitude of the first accelerometer 114 along the second axis 124 may be multiplied by the second distance 132 and the magnitude of the second accelerometer 116 along the second axis 124 may be multiplied by the first distance 130 before comparing the two acceleration magnitudes. If the compared acceleration magnitudes of the first accelerometer 114 and the second accelerometer 116 along the second axes 124 are not equal and opposite in direction, then a determination may be made in block 710 that there is an fault condition in one or both of the accelerometers, and the test wafer may be withdrawn from use for repair and/or an error code message may be produced in block 712. If no fault condition is identified, then the technique may proceed to block 714, in which no error code may be generated.

Figure 8:
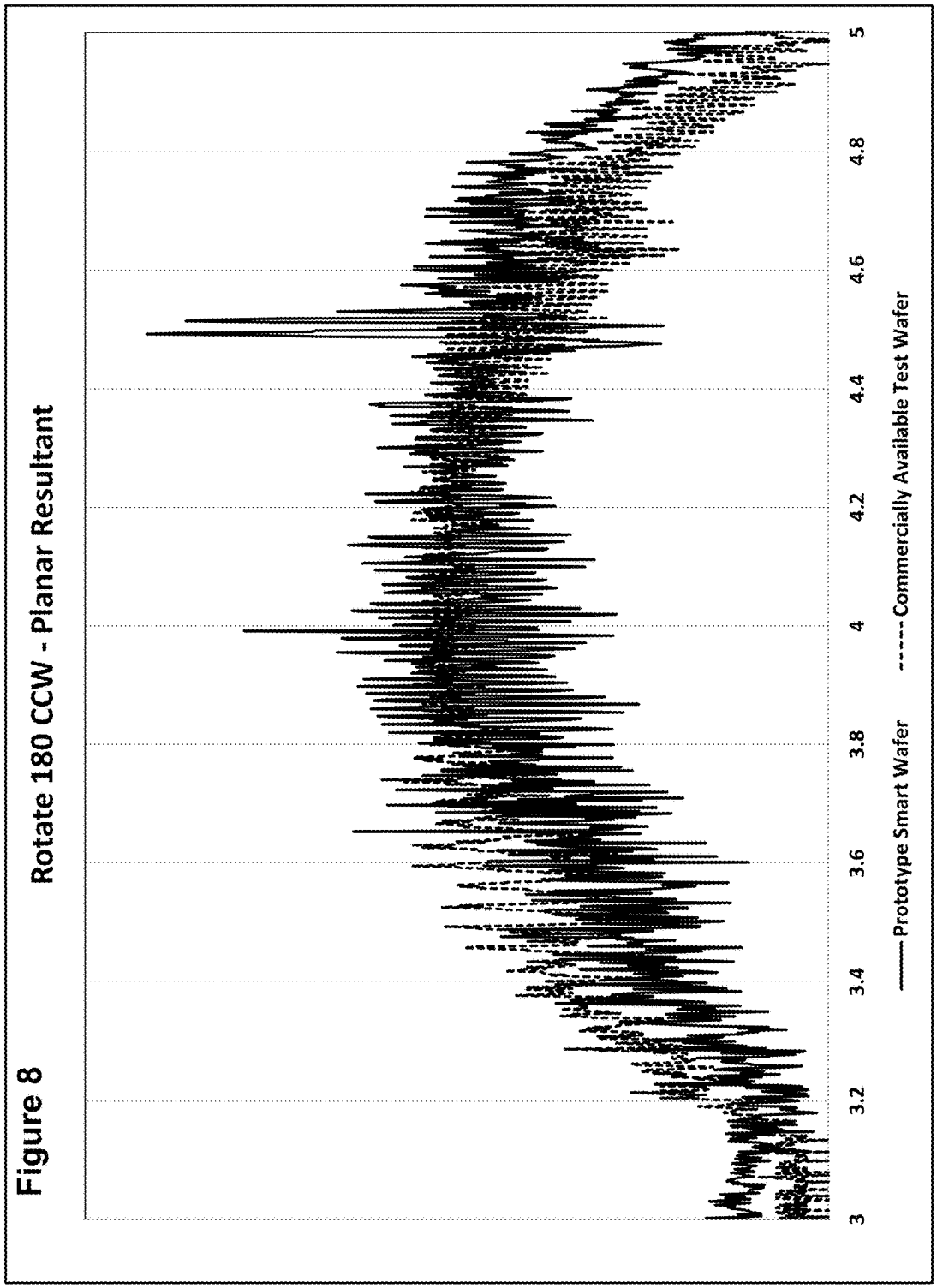
FIGS. 8 and 9 depict plots of data collected using a commercially available test wafer with a single tri-axial accelerometer as well as with the prototype test wafer depicted in FIG. 3.
Figure 9:
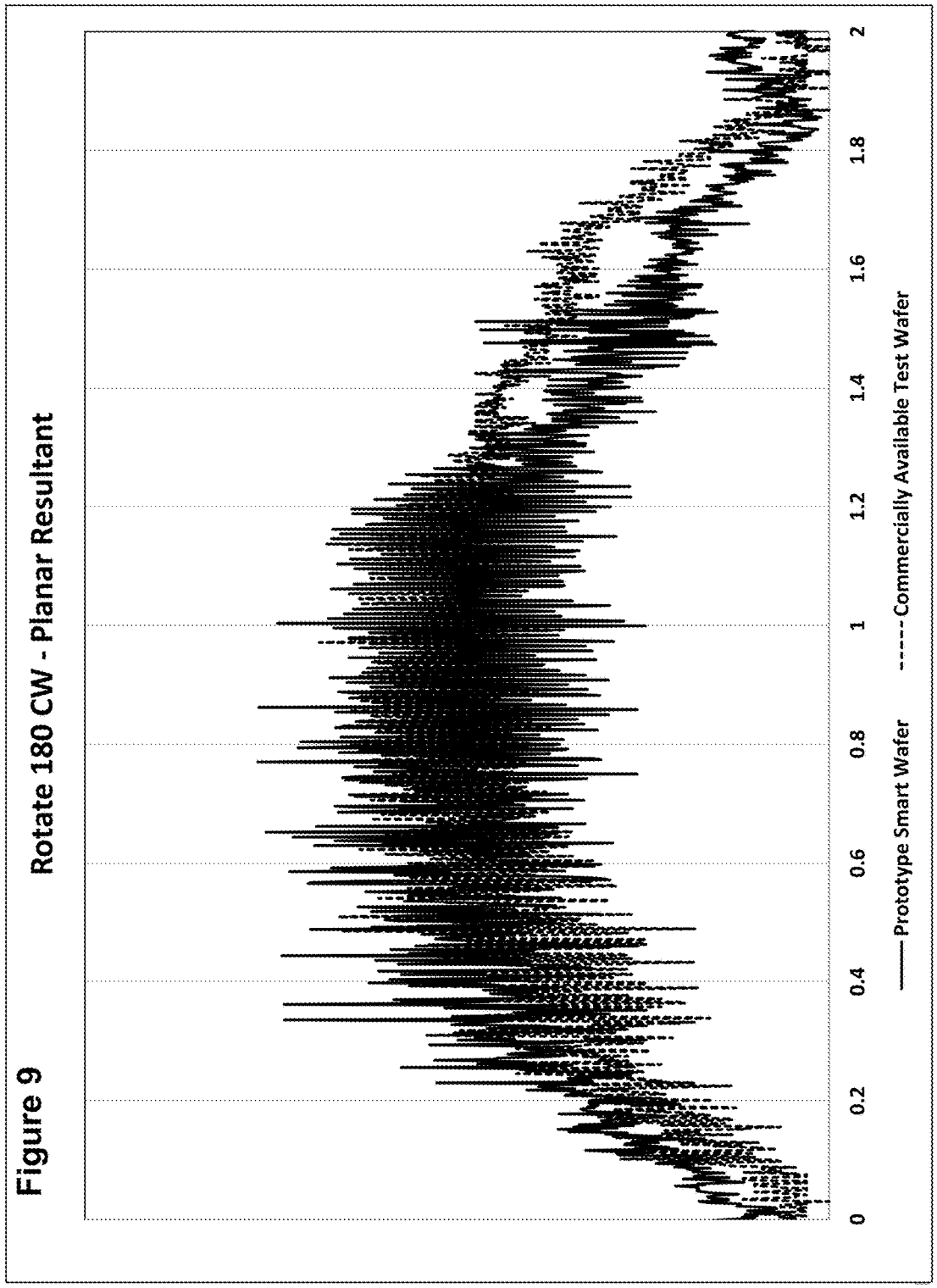

FIGS. 8 and 9 depict plots of data collected using a commercially available test wafer with a single tri-axial accelerometer as well as with the prototype test wafer depicted in FIG. 3. Both the commercially available test wafer and the prototype test wafer were simultaneously exposed to the same dynamic environment on the same wafer handling robot (the wafer handling robot was a dual-arm robot and could thus carry both test wafers simultaneously—FIG. 8 represents a 180° rotation in the counter-clockwise direction, whereas FIG. 9 represents a 180° rotation in the clockwise direction). The plots show the measured planar resultant at the center-of-gravity of the test wafer through 2 seconds of rotational movement (the vertical axis does not have units, but is linear in nature). As can be seen, the acceleration traces between the prototype and the commercially available unit are very similar, but there are deviations visible in the data for FIG. 8—specifically, from about 3.1 to 3.7 seconds, the commercially available unit registers a higher resultant acceleration, and from about 4.5 to 5 seconds, the commercially available unit registers a lower resultant acceleration. In FIG. 9, the commercially available unit registers a lower resultant acceleration in the first 0.5 seconds, and a markedly higher resultant from 1.3 to 1.8 seconds. It is to be noted that the accelerometers used in the prototype test wafer were not precisely aligned with a common axis that passed through the wafer CG (see, for example, the placement of the accelerometers in FIG. 3) and were not calibrated when this data was collected, so the data shown may have some error, although it is believed to be generally accurate.

As can be seen, the accelerometer signals produced by the accelerometers have significant amounts of noise, and may differ from one another even when measuring the same acceleration conditions or when producing theoretically equal or equal and opposite acceleration magnitudes, e.g., such as in the testing discussed earlier. It is to be understood that the acceleration magnitudes that are produced using the data from the accelerometers may be smoothed, averaged, or otherwise processed before being used, either for data collection purposes or for self-testing purposes. Thus, for example, acceleration data from the first accelerometer and the second accelerometer may be smoothed over averaged over a predefined interval prior to checking to see if the acceleration data from both accelerometers is equal in magnitude. Additionally, any comparison of accelerometer data from two separate accelerometers may, of course, include a tolerance, e.g., if the acceleration magnitudes along common axes of two accelerometers are within ±0.5%, ±1%, ±2%, or ±5% of each other, then such acceleration magnitudes may be deemed "the same" for the purpose of self-testing the test wafer.

It is common to define wafer handling robot operating parameters based on the peak accelerations seen by substrates (or expected to be seen by substrates) during substrate transport operations. For example, various factors, such as contact pad contact area, coefficient of friction, wear factors, factors of safety, etc. may all contribute to a determination that a substrate should not be exposed to accelerations during substrate transport that are above a particular threshold, e.g., 0.3 g. In order to minimize the duration of substrate transport operations, the wafer handling robot may be configured to transport substrates according to a movement profile that attempts to operate near or at this acceleration threshold. A test wafer may then be used to validate such a movement profile—however, if the test wafer is inaccurately reporting the peak accelerations experienced by the substrate, then the validation of the movement profile may be suspect. Accordingly, use of a test wafer such as the multi-accelerometer test wafers discussed herein may allow for more accurate movement profile configuration when setting up a wafer handling robot.

Figure 10:
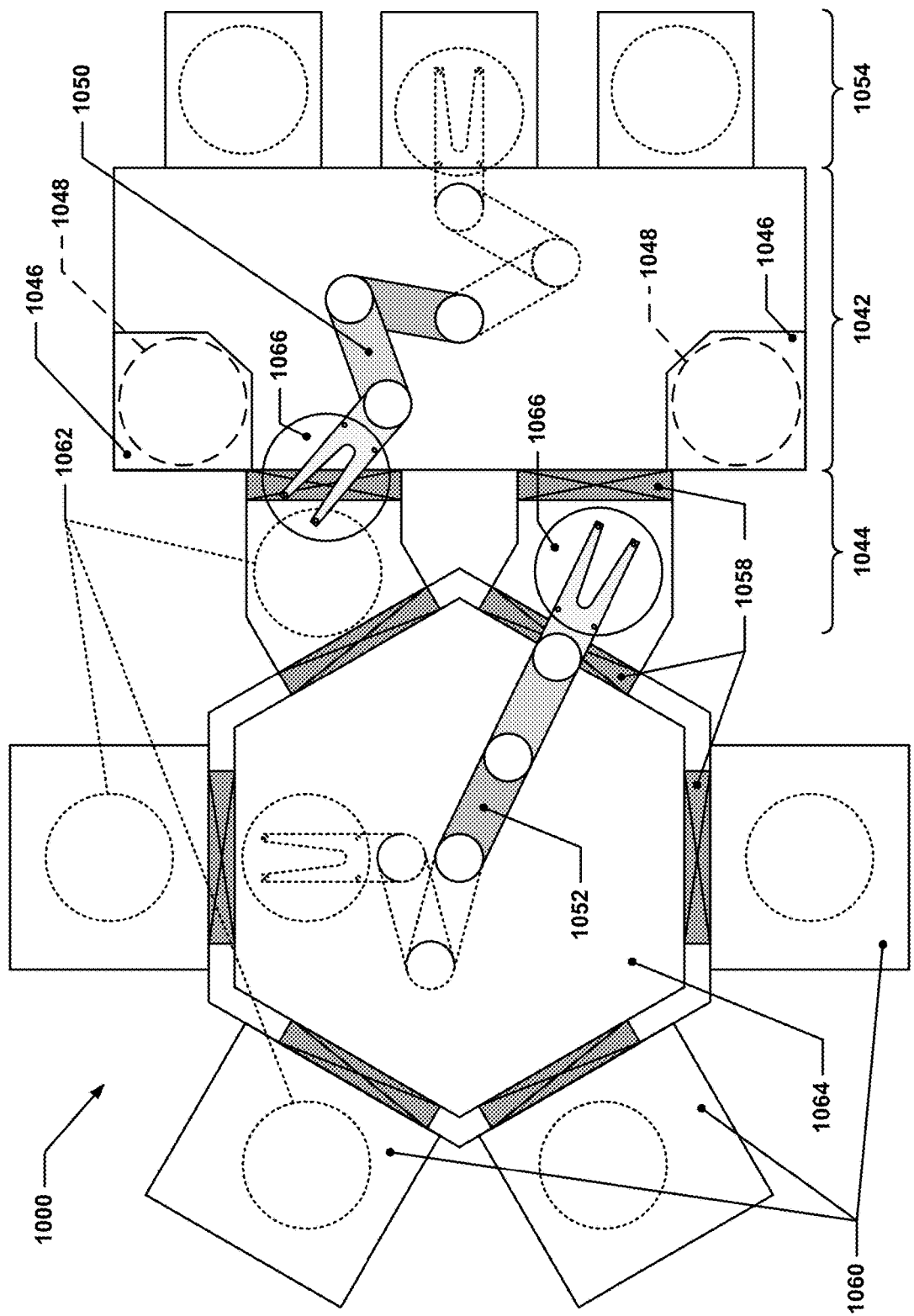
FIG. 10 depicts a plan view diagram of an example semiconductor processing tool having a built-in test wafer feature.

As discussed earlier herein, other implementations may include a semiconductor processing tool that is configured to communicate, either directly or indirectly, with a test wafer such as is described above. FIG. 10 depicts a plan view diagram of an example semiconductor processing tool 1000 having a built-in test wafer feature. The semiconductor processing tool 1000 may include an EFEM 1042 that is connected to a plurality of load ports 1054 and to a transfer chamber 1064 by way of a pair of load locks 1044. The transfer chamber 1064 may have a plurality of semiconductor processing chambers 1060 connected around the periphery of the transfer chamber 1064. The semiconductor processing chambers 1060 and the load locks 1044 may be sealable using one or more gate valves 1058. The EFEM 1042 may have a wafer handling robot 1050 that may be used to transport substrates, such as substrate 1066, between the load locks 1044 and FOUPs (not shown) interfaced with the load ports 1054. The transfer chamber 1064 may have a wafer handling robot 1052 similar to the wafer handling robot 1050, but configured to transfer substrates between the load locks 1044 and substrate stations 1062 in the semiconductor processing chambers 1060. Other substrate stations 1062 may include stations 1062 within the load locks 1044, as well as stations 1062 associated with each load port 1054. The wafer handling robots 1050 and 1052 may be rotated and extended/retracted in order to transport substrates 1066 through the semiconductor processing tool 1000; some example alternate positions of the wafer handling robots 1050 and 1052 are depicted in dotted outlines.

Visible in FIG. 10 are two test wafer receptacles 1046, which are located within the EFEM in two of the corners of the EFEM. While two test wafer receptacles are 1046 are shown, some implementations may only feature a single test wafer receptacle 1046. The test wafer receptacles 1046 may serve as holding areas for housing a test wafer, such as the test wafers described herein, that may be periodically retrieved by the wafer handling robot 1050 and used to perform a test cycle. It is to be understood that the test wafer receptacle is not a receptacle normally used to store wafers that are processed using the semiconductor processing tool, e.g., the test wafer receptacle is not a wafer buffer, a load lock, a front-opening unified pod, etc., but is instead a dedicated receptacle that may be used to store the test wafer while still allowing semiconductor wafers to be passed through the semiconductor processing tool during normal operation without requiring movement or relocation of the test wafer. The test wafer receptacle, for example, may include systems that may be specifically tailored for interfacing with the test wafer. For example, in some implementations, the test wafer receptacle may include an inductive charging system that may inductively couple with an inductive charging coil on or in the test wafer when the test wafer is docked in the test wafer receptacle to allow a rechargeable battery on the test wafer to be recharged in between test cycles. In some implementations, the test wafer receptacle may also include rotational and/or linear alignment mechanisms that may be used to align or re-align the test wafer in between test cycles. For example, the test wafer receptacle may include a turntable that may be used to rotate the test wafer to a particular angular orientation. In a further example, the test wafer receptacle may include a single- or dual-axis translation mechanism that allows the test wafer to be moved along one or two axes. For example, if the test wafer moves slightly relative to the wafer handling robot end effector during a test cycle, this slippage may result in the test wafer being positioned off-center in the test wafer receptacle when the test wafer is returned to the test wafer receptacle. Such off-center positioning may be detected using, for example, optical or machine vision sensors in the test wafer receptacle, e.g., that may detect multiple positions along the edges of the test wafer to allow the test wafer position relative to the test wafer receptacle to be determined. The test wafer may include a fiduciary mark or indexing mark along the outer edge, e.g., a notch or otherwise detectable marking, to allow the test wafer angular position to be determined by such sensors. In situations in which the test wafer is identified as being misaligned, the alignment mechanisms in the test wafer receptacle may be engaged to move and/or rotate the test wafer so that the test wafer is correctly positioned within the test wafer receptacle. Once the test wafer is correctly positioned, in some implementations, the wafer handling robot may be used to lift the test wafer off of the alignment mechanism to allow the alignment mechanism to be re-set into its initial position; once the alignment mechanism is re-set into its initial position, the test wafer may be placed back onto the alignment mechanism, leaving the test wafer and the alignment mechanism both in an aligned state.

The wafer handling robot 1050 may, if testing of the wafer handling robot 1052 is desired, pass the test wafer to the wafer handling robot 1052 through the load lock 1044 to allow the wafer handling robot 1052 to perform a test cycle.

The test wafer that is used may have a communications interface that provides for wireless communications with another device, e.g., with a system controller for the semiconductor processing tool, which may control the overall operation of the semiconductor processing tool 1000, or with a sub-controller of a component of the semiconductor processing tool 1000, for example, with a wafer handling robot controller.

Figure 11:
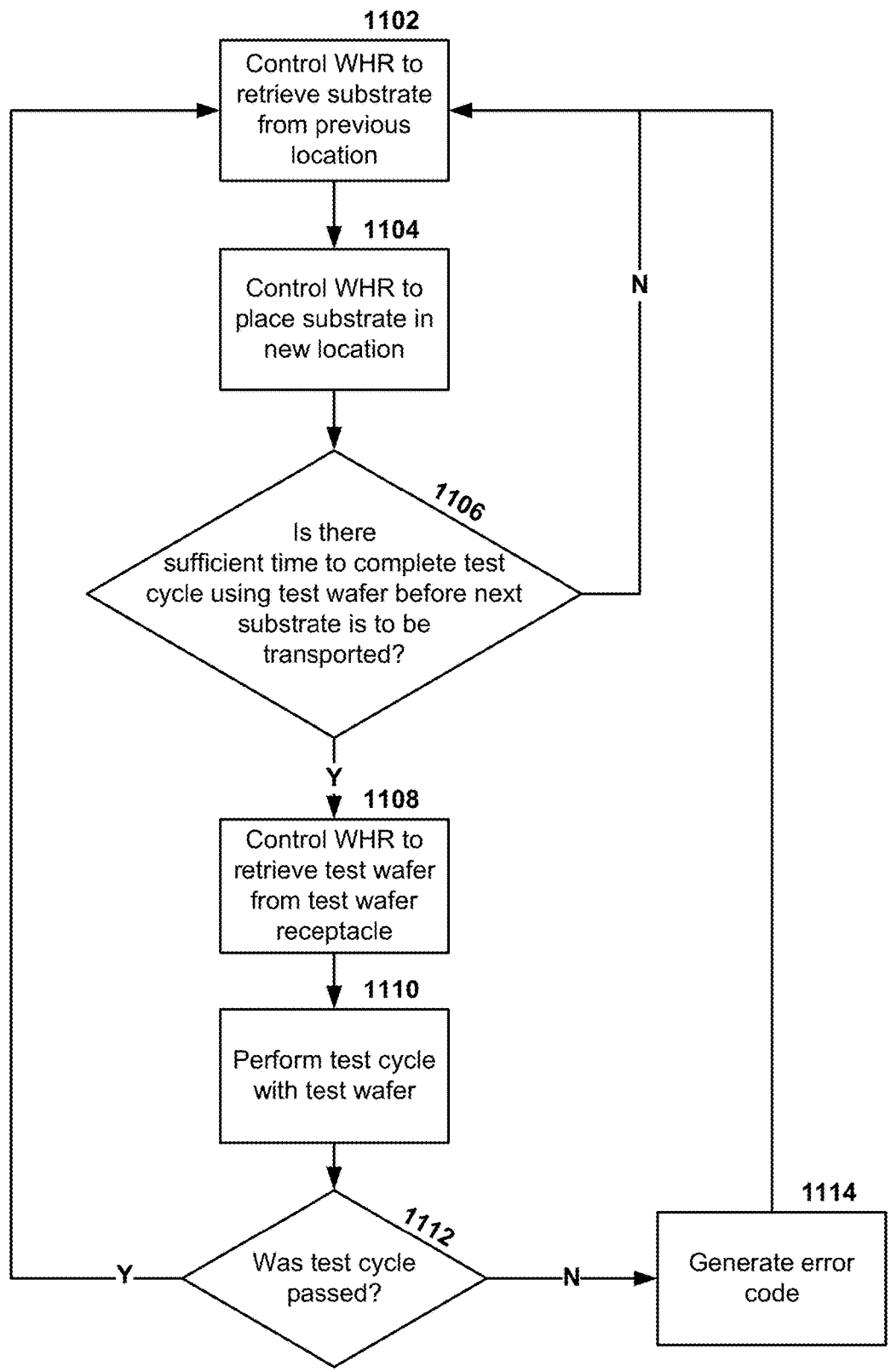
FIG. 11 depicts a flow diagram for an example technique for using a test wafer in a semiconductor processing tool.

As mentioned earlier, the system controller for the semiconductor processing tool may control the movement of substrates through the semiconductor processing tool, and may schedule the movement of substrates in a manner that results in a desired level of substrate throughput. FIG. 11 depicts a flow diagram for one example such technique for using a test wafer in a semiconductor processing tool. In block 1102, for example, a wafer handling robot (WHR) may be controlled to retrieve a substrate from a location in the semiconductor processing tool and may subsequently be placed, in block 1104, in new location in the tool. After each substrate has been placed, a determination may be made in block 1106 as to whether there is sufficient time to complete a test cycle with the wafer handling robot using the test wafer before the next scheduled substrate transport operation. If it is determined in block 1106 that there is insufficient time to complete the test cycle, then the technique may return to block 1102 for further substrate transport operations. However, if it is determined in block 1106 that there is sufficient time to perform a test cycle, then the wafer handling robot may be controlled in block 1108 to retrieve the test wafer from the test wafer receptacle and to perform the test cycle in block 1110, at the conclusion of which the wafer handling robot may be controlled to return the test wafer to the test wafer receptacle. If it is determined in block 1112 that the test cycle was passed, then the technique may return to block 1102 for further substrate transport operations. However, if it is determined in block 1112 that the test cycle was not passed, then the technique may proceed to block 1114, where an error code may be generated indicating that the wafer handling robot may require service.

For example, the system controller for the semiconductor processing tool may periodically determine that a test cycle should be performed by one or both of the wafer handling robots 1050 and 1052, and, having made such a determination, may then determine when the wafer handling robot that is to be tested will next be idle for a sufficiently long interval so as to be able to perform the test cycle without impacting the movement of the substrates throughout the semiconductor processing tool 1000 or, if this is not possible, with a minimal amount of such impact.

When the system controller determines that it is time to perform a test cycle, the system controller may, for example, cause a robot arm controller that controls the wafer handling robot 1050 to execute a test cycle. During the test cycle, the wafer handling robot controller may cause the wafer handling robot 1050 to retrieve the test wafer from the test wafer receptacle 1046 and to initiate a communications connection with the test wafer, e.g., through a wireless communications technique, such as Bluetooth. The wafer handling robot controller may, after establishing the communications connection with the test wafer, optionally initiate one or more validation movements that may be used to verify that the accelerometers on the test wafer are functioning properly. For example, the wafer handling robot controller may cause the end effector of the wafer handling robot to extend and retract along a single axis, and the accelerations measured by each accelerometer in the test wafer may then be compared to see if the difference between those accelerations exceeds a threshold allowable difference. If the difference between the measured accelerations is sufficiently large enough, then the wafer handling robot controller may generate a signal indicative of an error condition in the test wafer and/or may return the test wafer to the test wafer receptacle without performing the remainder of the test cycle. In some implementations, the test wafer may be rotationally aligned to a common orientation before each test cycle. For example, the test wafer receptacle may include an aligner or other rotational element that allows the test wafer to be indexed to a particular rotational orientation prior to being retrieved by the wafer handling robot. This allows the test wafer to be oriented in the same orientation for each test, which may simplify data analysis.

After the test wafer has been validated, if such validation operations are performed, the wafer handling robot controller may cause the end effector of the wafer handling robot to perform a diagnostic test in which it performs one or more predefined movements while supporting the test wafer. The predefined movements may be selected so as to expose the test wafer to environments in which accelerations (or average accelerations, in some cases) at various levels are expected. If the measured accelerations deviate from the expected levels of acceleration by a significant enough margin, e.g., ±10%, then a determination may be made that the wafer handling robot has failed the test cycle. For example, if the measured accelerations are less than expected, this may indicate that the test wafer is slipping, which may be indicative of overly worn contact pads or a malfunctioning drive system in the wafer handling robot. If the measured accelerations are more than expected, then this may indicate that the wafer has slipped and suddenly caught itself, or that the wafer handling robot drive system is driving the end effector too quickly.

Once the test cycle is completed, the test wafer may be returned to the test wafer receptacle, where it may be recharged by a charging system that is part of the test wafer receptacle, e.g., a system that makes electrical contact with recharging terminals on the test wafer or a system that uses inductive charging to recharge the power source of the test wafer using an inductive loop or coil.

In some implementations, the test wafer receptacle may be positioned outside of the EFEM, but joined to it via a passageway or other opening. For example, the test wafer receptacle may include an enclosure that is bolted or otherwise attached to a side wall of the EFEM, e.g., on the short sides of an EFEM spanning between the sides of the EFEM having the load port(s) and the load lock(s). In some implementations, the test wafer receptacle may be positioned along the same wall of the EFEM that interfaces with the load lock(s). In such implementations, the test wafer receptacle may be positioned above one or both of the load locks to avoid having the test wafer receptacle protrude out of the side of the EFEM.

Figure 12:
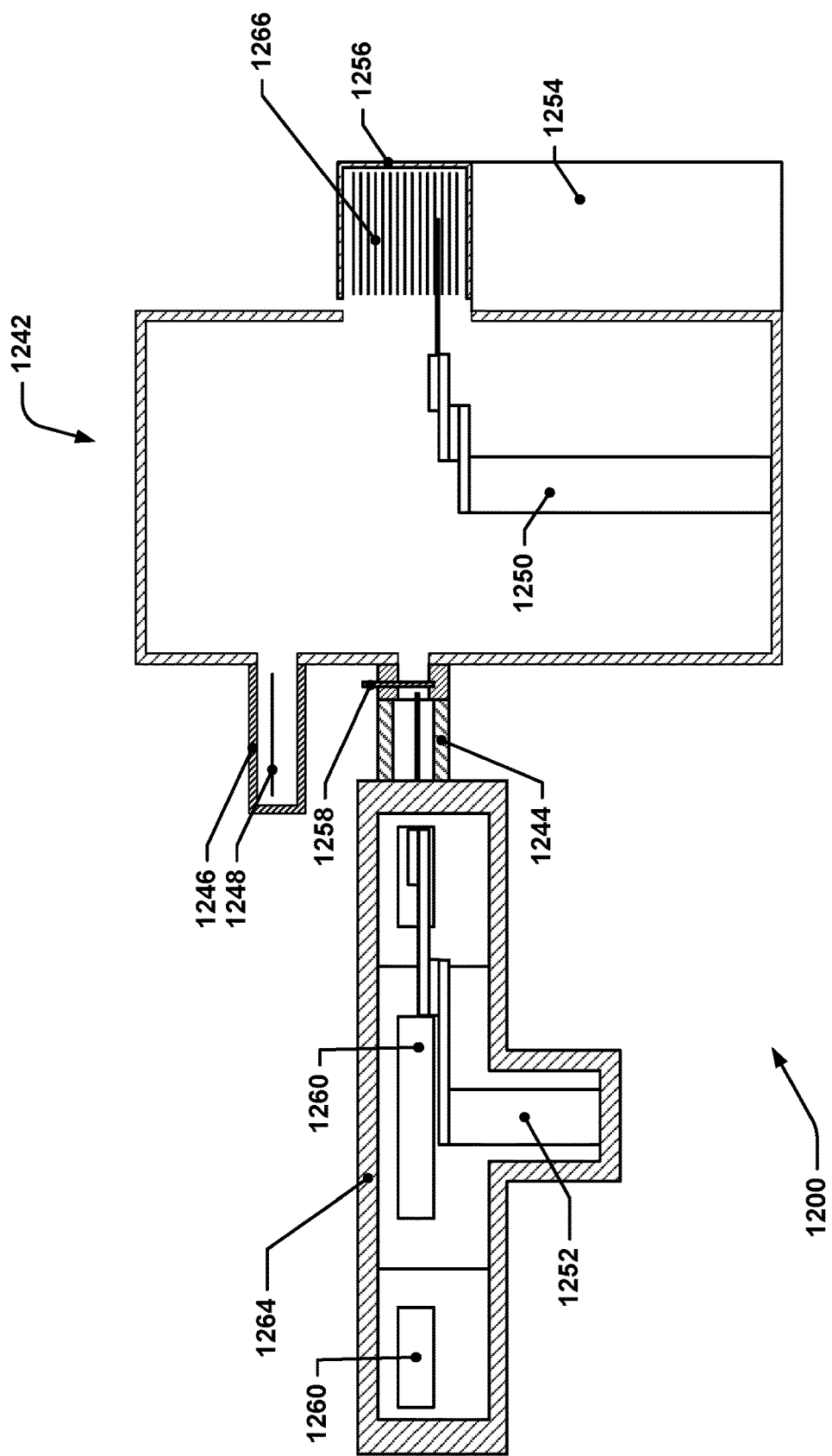
FIG. 12 depicts a side view of a semiconductor processing tool in which a test wafer receptacle is attached to the exterior of an EFEM.

FIG. 12, for example, depicts a side view of a semiconductor processing tool 1200 in which a test wafer receptacle 1246 is attached to the exterior of an EFEM 1242; the test wafer receptacle 1246 is positioned on a side of the EFEM 1242 opposite from where a plurality of load ports 1254 are positioned. Each load port 1254 may have an interface for receiving a FOUP 1256 that contains a plurality of substrates that may be transported through gate valve 1258 by the wafer handling robot 1250 to load locks 1244. From there, the substrate may be retrieved by the wafer handling robot 1252 in the transfer chamber 1264 for transport between the load locks 1244 and semiconductor process chambers 1260.

During a test cycle, the wafer handling robot 1250 may be translated upwards to allow the end effector of the wafer handling robot 1250 to access the test wafer receptacle 1246 and retrieve the test wafer 1248. Similarly, once the test cycle is complete, the wafer handling robot controller may cause the wafer handling robot 1250 to return the test wafer to the test wafer receptacle.

For test wafer receptacles mounted to the exterior of the EFEM, it is generally not feasible to locate the test wafer receptacles in positions or below the load ports, as the space in the lower portion of the load ports may be occupied by FOUP door opening and closing mechanisms, and the space above the FOUP may need to be kept clear to allow FOUPs to be raised from and lowered onto the load ports.

As discussed earlier, in semiconductor processing tools with integrated test wafer receptacles, the test wafer receptacles are configured to remain permanently affixed to the semiconductor processing tool, thereby allowing the test wafer to be retrieved by the wafer handling robot at any time in order to perform a test cycle.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the invention.

What is claimed is:

1. A system comprising:
    a test wafer, the test wafer including:
        a platform, the platform sized to be carried by an end effector of a wafer handling robot in a semiconductor processing tool,
        a first accelerometer, and
        a second accelerometer; and
    a controller including one or more processors and a memory operably connected with the one or more processors, wherein:
        the first accelerometer and the second accelerometer are biaxial or triaxial accelerometers,
        the first accelerometer and the second accelerometer are positioned on the platform at spaced-apart locations along a common axis that crosses the center of gravity of the test wafer when viewed along a direction perpendicular to the platform, and
        the memory stores computer-executable instructions for controlling the one or more processors to:
            obtain acceleration data generated by the first accelerometer and the second accelerometer, wherein the acceleration data includes (a) data from the first accelerometer indicative of magnitudes of acceleration along a first axis of the first accelerometer parallel to the common axis and a second axis of the first accelerometer perpendicular to the first axis and (b) data from the second accelerometer indicative of magnitudes of acceleration along a first axis of the second accelerometer parallel to the common axis and a second axis of the second accelerometer perpendicular to the first axis, and
            determine rotational acceleration in the plane of the platform about the center of gravity of the test wafer using the acceleration data.

2. The system of claim 1, wherein the controller is supported by the platform.

3. The system of claim 2, wherein the controller is located in a device remote from the test wafer.

4. The system of claim 1, wherein the computer-executable instructions for controlling the one or more processors to determine the rotational acceleration in the plane of the platform about the center of gravity of the test wafer using the acceleration data include instructions for controlling the one or more processors to:
    determine a CG acceleration magnitude at the center of gravity of the test wafer and along an axis parallel to the second axes,
    determine a first tangential acceleration magnitude, at least in part, by subtracting the CG acceleration magnitude from the magnitude of acceleration along the second axis for the first accelerometer, and
    determine the rotational acceleration using at least the first tangential acceleration magnitude and a distance between the first accelerometer and the center of gravity of the test wafer in the plane of the test wafer.

5. The system of claim 4, further comprising a third accelerometer positioned on the platform and located at the center of gravity of the test wafer, wherein:
    the acceleration data further includes data from the third accelerometer indicative of a magnitude of acceleration along an axis parallel to the second axis of the first accelerometer, and
    the instructions for controlling the one or more processors to determine the CG acceleration magnitude cause the one or more processors to use the magnitude of acceleration from the third accelerometer and along the axis parallel to the second axis of the first accelerometer as the CG acceleration magnitude.

6. The system of claim 4, wherein:
    the first accelerometer and the second accelerometer are equidistantly spaced from the center of gravity of the test wafer, and
    the instructions for controlling the one or more processors to determine the CG acceleration magnitude cause the one or more processors to average the magnitudes of acceleration along the second axes for the first accelerometer and the second accelerometer to obtain the CG acceleration magnitude.

7. The system of claim 4, wherein the computer-executable instructions for controlling the one or more processors to determine the rotational acceleration in the plane of the platform about the center of gravity of the test wafer using the acceleration data include further instructions causing the one or more processors to:
    determine a second tangential acceleration magnitude, at least in part, by subtracting the CG acceleration magnitude from the magnitude of acceleration along the second axis for the second accelerometer, and
    determine the rotational acceleration using at least the first tangential acceleration magnitude, the distance between the first accelerometer and the center of gravity of the test wafer in the plane of the test wafer, the second tangential acceleration magnitude, and a distance between the second accelerometer and the center of gravity of the test wafer in the plane of the test wafer.

8. The system of claim 1, wherein:
the first accelerometer and the second accelerometer are equidistantly spaced from the center of gravity of the test wafer, and
the computer-executable instructions further include instructions for controlling the one or more processors to:
determine a first CG acceleration magnitude along a first CG axis parallel to the first axes and at the center of gravity of the test wafer by averaging the magnitudes of acceleration along the first axes of the first accelerometer and the second accelerometer, and
determine a second CG acceleration magnitude along a second CG axis parallel to the second axes at the center of gravity of the test wafer by averaging the magnitudes of acceleration along the second axes of the first accelerometer and the second accelerometer.

9. The system of claim 8, further comprising a third accelerometer positioned on the platform and located at the center of gravity of the test wafer, wherein:
the computer-executable instructions further include instructions for controlling the one or more processors to:
obtain CG acceleration data from the third accelerometer,
compare a magnitude of acceleration for the third accelerometer along an axis parallel to the first axes of the first and second accelerometers against the first CG acceleration magnitude to determine a first acceleration delta,
compare a magnitude of acceleration for the third accelerometer along an axis parallel to the second axes of the first and second accelerometers against the second CG acceleration magnitude to determine a second acceleration delta,
determine whether an error condition exists by comparing at least one item selected from the group consisting of: the first acceleration delta, the second acceleration delta, and the first acceleration delta and the second acceleration delta against a first threshold, and
cause a first error code signal to be generated responsive to a determination that the error condition exists.

10. The system of claim 9, wherein the computer-executable instructions further include instructions for controlling the one or more processors to:
determine a CG acceleration magnitude at the center of gravity of the test wafer and along an axis parallel to the second axes of the first and second accelerometers,
determine a first tangential acceleration magnitude, at least in part, by subtracting the CG acceleration magnitude from the magnitude of acceleration along the second axis for the first accelerometer,
determine a second tangential acceleration magnitude, at least in part, by subtracting the CG acceleration magnitude from the magnitude of acceleration along the second axis for the second accelerometer,
compare the first tangential acceleration magnitude to the second tangential acceleration magnitude to determine a) whether the first tangential acceleration magnitude is opposite in direction to the second tangential acceleration magnitude and b) whether the absolute magnitude of the first tangential acceleration magnitude and the absolute magnitude of the second tangential acceleration magnitude are within a second threshold amount of one another, and cause a second error code signal to be generated responsive to either or both of a) or b) not being met.

11. The system of claim 1, wherein:
the first accelerometer is positioned a first distance away from the center of gravity of the test wafer and the second accelerometer is positioned a second distance away from the center of gravity of the test wafer such that the center of gravity of the test wafer is between the first accelerometer and the second accelerometer, and
the computer-executable instructions further include instructions for controlling the one or more processors to:
determine a first CG acceleration magnitude along a first CG axis parallel to the first axes and at the center of gravity of the test wafer by dividing the sum of the first distance times the magnitude of acceleration along the first axis for the second accelerometer and the second distance times the magnitude of acceleration along the first axis for the first accelerometer by the sum of the first distance and the second distance, and
determine a second CG acceleration magnitude along a second CG axis parallel to the second axes and at the center of gravity of the test wafer by dividing the sum of the first distance times the magnitude of acceleration along the second axis for the second accelerometer and the second distance times the magnitude of acceleration along the second axis for the first accelerometer by the sum of the first distance and the second distance.

12. A system comprising:
a test wafer, the test wafer including:
a platform, the platform sized to be carried by an end effector of a wafer handling robot in a semiconductor processing tool, and
two or more accelerometers, the two or more accelerometers including a first accelerometer and a second accelerometer that are positioned on the platform at spaced-apart locations along a common axis that crosses the center of gravity of the test wafer when viewed along a direction perpendicular to the platform;
the semiconductor processing tool, the semiconductor processing tool including:
an equipment front end module (EFEM) having one or more load ports each configured to receive a front-opening unified pod (FOUP) containing one or more substrates having a nominal substrate size,
one or more semiconductor processing chambers,
a load lock interposed between the EFEM and the one or more semiconductor processing chambers,
a test wafer receptacle sized to receive the test wafer, the test wafer receptacle located in a location selected from the group consisting of: within the EFEM and adjacent the EFEM, and
the wafer handling robot located in the EFEM and having the end effector configured to transport wafers between the one or more load ports and the load lock; and
one or more processors and one or more memories, the one or more memories storing computer-executable instructions for controlling the one or more processors to:
cause the one or more semiconductor processing chambers to perform one or more semiconductor processing operations on substrates placed into the one or more semiconductor processing chambers, cause the wafer handling robot to transport substrates between the one or more load ports and the load lock according to a schedule driven by the semiconductor processing operations performed on the substrates, and cause the wafer handling robot to perform a test cycle during a test interval selected such that the transport of substrates between the one or more load ports and the load lock is not interrupted by the test cycle, wherein the test cycle includes retrieving the test wafer from the test wafer receptacle, performing a diagnostic test with the test wafer involving obtaining acceleration data from the first accelerometer and the second accelerometer, and returning the test wafer to the test wafer receptacle.

13. The system of claim 12, wherein:

the test wafer further includes a communications interface, there are two or more processors and two or more memories, at least one of the two or more processors and at least one of the two or more memories are part of a test wafer controller supported by the platform and at least one other of the two or more processors and at least one other of the two or more memories are part of a tool controller that is part of the semiconductor processing tool, and the at least one memory of the test wafer controller stores computer-executable instructions for controlling the at least one processor of the test wafer controller to transmit the acceleration data via the communications interface to the tool controller.

14. The system of claim 12, wherein the test wafer receptacle is fixed with respect to the EFEM.

15. The system of claim 12, wherein the test cycle further includes performing an accelerometer calibration check on the test wafer by comparing data derived from at least one of the accelerometers on the test wafer against data derived from at least one of the other accelerometers on the test wafer.

16. The system of claim 12, wherein the test wafer receptacle:

is located adjacent the EFEM, and is connected with the EFEM by an opening sized to allow the test wafer to be inserted into the test wafer receptacle from the EFEM.

17. The system of claim 12, wherein:

the EFEM has a substantially rectangular interior volume when viewed from a direction perpendicular to the substrates, and the test wafer receptacle is positioned in one of the corners of the rectangular interior volume.

18. The system of claim 12, wherein the one or more memories store computer-executable instructions for controlling the one or more processors to:

cause the wafer handling robot to perform one or more motions associated with the test cycle during the test cycle;

receive data collected by the accelerometers on the test wafer during the test cycle;

determine whether the data collected by the accelerometers on the test wafer passes a test condition involving one or more criteria associated with the one or more motions; and generate an error condition signal responsive to determining that the data collected by the accelerometers fails to pass the test condition.

19. The system of claim 18, wherein the error condition signal includes information indicating that the wafer handling robot requires servicing.

20. The system of claim 18, wherein the one or more memories further store computer-executable instructions for controlling the one or more processors to periodically cause the test cycle to be performed on a recurring basis according to a baseline schedule.

* * * * *